US 011855615B2

(12) United States Patent
Colles et al.

(10) Patent No.: US 11,855,615 B2
(45) Date of Patent: Dec. 26, 2023

(54) ADAPTIVE CONTROL OF NON-OVERLAPPING DRIVE SIGNALS

(71) Applicant: Silanna Asia Pte Ltd, Singapore (SG)

(72) Inventors: Joseph H. Colles, Bonsall, CA (US); Steven E. Rosenbaum, San Diego, CA (US); Stuart B. Molin, Carlsbad, CA (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 18/166,793

(22) Filed: Feb. 9, 2023

(65) Prior Publication Data

US 2023/0188132 A1     Jun. 15, 2023

Related U.S. Application Data

(63) Continuation of application No. 16/949,304, filed on Oct. 23, 2020, now Pat. No. 11,611,337, which is a continuation of application No. 16/600,857, filed on Oct. 14, 2019, now Pat. No. 10,855,270.

(51) Int. Cl.
| | |
|---|---|
| *H03K 17/14* | (2006.01) |
| *H03K 21/38* | (2006.01) |
| *H03K 5/133* | (2014.01) |
| *H02M 3/158* | (2006.01) |
| *H02M 1/38* | (2007.01) |
| *H02M 1/08* | (2006.01) |
| *H03K 5/00* | (2006.01) |

(52) U.S. Cl.
CPC ............ *H03K 17/145* (2013.01); *H02M 1/08* (2013.01); *H02M 1/38* (2013.01); *H02M 3/158* (2013.01); *H03K 5/133* (2013.01); *H03K 21/38* (2013.01); *H03K 2005/00019* (2013.01); *H03K 2005/00078* (2013.01); *H03K 2005/00247* (2013.01)

(58) Field of Classification Search
CPC .................................................. H03K 17/145
USPC ......................................................... 327/109
See application file for complete search history.

(56) References Cited

U.S. PATENT DOCUMENTS

| | | | | |
|---|---|---|---|---|
| 6,396,250 B1 * | 5/2002 | Bridge | ................. | H03K 17/165 323/283 |
| 7,227,391 B2 * | 6/2007 | Araki | ................. | H03K 19/0013 318/434 |

(Continued)

OTHER PUBLICATIONS

Notice of Allowance and Fees dated May 19, 2021 for U.S. Appl. No. 16/949,304.

(Continued)

*Primary Examiner* — Tomi Skibinski
(74) *Attorney, Agent, or Firm* — MLO, a professional corp.

(57) ABSTRACT

An improved circuit or method generates first and second initial pulses that do not overlap. First and second drive pulses are generated based on the first and second initial pulses, respectively. A first transistor is turned on with the first drive pulses. A second transistor is turned on with the second drive pulses. A current flows in response to an on-time state of the first transistor overlapping with an on-time state of the second transistor. A delay of the second drive pulses is decreased based on a time of the current flow overlapping with one of the first initial pulses; and the delay of the second drive pulses is increased based on the time of the current flow overlapping with one of the second initial pulses.

20 Claims, 3 Drawing Sheets

(56) References Cited

U.S. PATENT DOCUMENTS

| 8,737,101 B2 * | 5/2014 | Cho ................. H02M 7/53803 |
| | | 363/131 |
| 2005/0110475 A1 | 5/2005 | Chapuis |
| 2008/0298101 A1 | 12/2008 | Kim et al. |
| 2015/0349762 A1 | 12/2015 | Kinder |
| 2016/0248412 A1 | 8/2016 | Kadowaki |
| 2017/0019015 A1 | 1/2017 | Wibben |

OTHER PUBLICATIONS

Notice of Allowance and Fees dated Nov. 30, 2022 for U.S. Appl. No. 16/949,304.
Notice of Allowance dated Jul. 22, 2020 for U.S. Appl. No. 16/600,857.

* cited by examiner

ADAPTIVE CONTROL OF NON-OVERLAPPING DRIVE SIGNALS

CROSS-REFERENCE TO RELATED APPLICATION

This application is a continuation of U.S. Non-Provisional application Ser. No. 16/949,304, filed Oct. 23, 2020, which is a continuation of U.S. Non-Provisional application Ser. No. 16/600,857, filed Oct. 14, 2019, all of which are incorporated by reference herein in their entirety.

BACKGROUND

There are some electronic circuits for which it is important to ensure that two transistors are not turned on at the same time. For example, some switching regulator circuits have a high side transistor and a low side transistor to switch a node between a power source and a ground to generate a regulated output voltage. The high side and low side transistors are often relatively large devices to be able to handle a relatively large current flow. If there were an overlap in the on-time states of the high side and low side transistors, then a current (known as a crowbar current, a shoot through current, or a short circuit current) could develop through these transistors directly from the power source to the ground. A large crowbar current could potentially damage or significantly reduce the operating efficiency of the high side and low side transistors, the switching regulator, or the overall electronic circuit in which the switching regulator is incorporated. It is important, therefore, not to allow overlap of the on-time states of the high side and low side transistors. However, the drive signals that turn the high side and low side transistors on and off typically pass through different components or pathways between the sources of the drive signals and these transistors. Thus, even if the drive signals are initially generated without any overlap of their on-time pulses (whether of the same or different polarity), by the time the on-time pulses reach the transistors, each on-time pulse may have been delayed by a different amount, so that the on-time pulses overlap at the point where they are applied to the transistors or the on-time states of the two transistors overlap. Additionally, the amount of delay of each drive signal may change due to changing operating conditions or external factors, such as temperature or supply voltage variations.

To prevent such overlap of the on-time pulses or on-time states, some switching regulator circuits are designed with a dead time (i.e., a time between the on-time pulses of both drive signals during which neither drive signal is on) that is sufficiently long that any potential delay that may be added to either of the drive signals will not be able to shift the drive signals enough to cause an overlap. However, a long dead time can adversely affect the efficiency of the switching regulator.

Some alternative solutions use a switching voltage at the node between the high side transistor and the low side transistor to determine when to shift the rising or falling edge of the on-time pulses to prevent overlap. (The level of the switching voltage can be an indirect indication of the occurrence of the crowbar current.) However, this technique can change the duration of the on-time pulses or can alter the switching voltage, thereby altering the performance of the switching regulator. Additionally, this technique can also add considerable complexity to the circuitry of the switching regulator.

SUMMARY

An improved circuit or method (e.g., for an improved switching regulator) that prevents overlap of on-time pulses, ensures relatively short dead times, and does not change the duration of the on-time pulses or alter the switching voltage generally includes generating first initial pulses within an integrated circuit; generating second initial pulses within the integrated circuit, the second initial pulses not overlapping in time with the first initial pulses; generating first drive pulses based on the first initial pulses; generating second drive pulses based on the second initial pulses; turning on a first transistor within the integrated circuit with the first drive pulses; turning on a second transistor within the integrated circuit with the second drive pulses; flowing a current in response to an on-time state of the first transistor overlapping with an on-time state of the second transistor; decreasing a delay of the second drive pulses based on a time of the current flow overlapping with one of the first initial pulses; and increasing the delay of the second drive pulses based on the time of the current flow overlapping with one of the second initial pulses.

In some embodiments, an electronic circuit includes a gate drive circuit, a first transistor in the gate drive circuit, a second transistor in the gate drive circuit, and a programmable delay circuit in the gate drive circuit. The gate drive circuit has a first drive voltage output at which first drive pulses are produced and a second drive voltage output at which second drive pulses are produced. The first drive pulses are based on first initial pulses, and the second drive pulses are based on second initial pulses, the first initial pulses not overlapping in time with the second initial pulses. The first transistor is driven by the first drive pulses. The second transistor is driven by the second drive pulses. A current is generated through the first transistor and the second transistor in response to an on-time state the first transistor overlapping with an on-time state the second transistor. The programmable delay circuit produces the second drive pulses as a delayed version of the second initial pulses. The programmable delay circuit decreases a delay of the second drive pulses based on a flow of the current coinciding with one of the first initial pulses. The programmable delay circuit increases the delay of the second drive pulses based on the flow of the current coinciding with one of the second initial pulses.

In some embodiments, a method includes generating first drive pulses; generating second drive pulses; driving a first current detection transistor and a first power transistor with the first drive pulses, wherein an array of first transistor segments comprises a first transistor segment and other first transistor segments, the first current detection transistor comprises the first transistor segment, and the first power transistor comprises the other first transistor segments; driving a second current detection transistor and a second power transistor with the second drive pulses, wherein an array of second transistor segments comprises a second transistor segment and other second transistor segments, the second current detection transistor comprises the second transistor segment, and the second power transistor comprises the other second transistor segments; producing a switching voltage at a phase node between the first power transistor and the second power transistor in response to turning on and off the first power transistor and the second power transistor; flowing a sample current through the first current detection transistor and the second current detection transistor in response to an on-time state the first current detection transistor overlapping with an on-time state the second current detection transistor; and reducing a crowbar current through the first power transistor and the second power transistor by shifting the second drive pulses based on a detection of the sample current through the first current detection transistor and the second current detection transistor.

In some embodiments, repeating the method adjusts the delay to an amount that results in the on-time state of the first transistor not overlapping with the on-time state of the second transistor. In some embodiments, the first transistor is one of an array of first transistor segments that includes other first transistor segments; the other first transistor segments form a first power transistor; the second transistor is one of an array of second transistor segments that includes other second transistor segments; the other second transistor segments form a second power transistor; the first power transistor and the second power transistor are electrically connected between a first power node and a second power node and produce a switching voltage at a phase node between the first power transistor and the second power transistor in response to turning on and off the first power transistor and the second power transistor; the method further comprises turning on the first power transistor with the first drive pulses and turning on the second power transistor with the second drive pulses; and after adjustments of the delay of the second drive pulses, the on-time state of the first transistor and the on-time state of the second transistor do not overlap, and an on-time state of the first power transistor and an on-time state of the second power transistor do not overlap.

DETAILED DESCRIPTION

Figure 1:
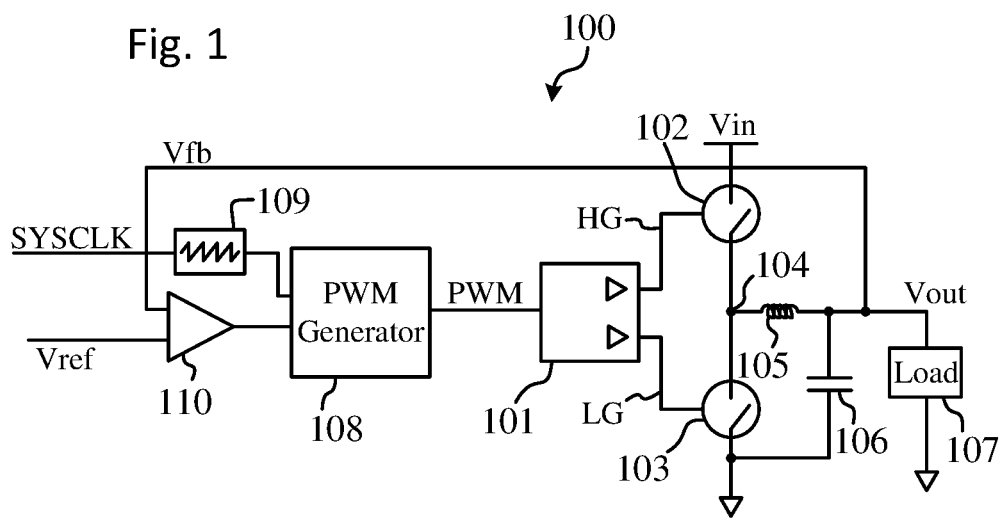
FIG. 1 is a simplified schematic diagram of a switching regulator, in accordance with some embodiments.

In accordance with some embodiments, a switching regulator 100, as shown in FIG. 1, is an electronic circuit that generally includes a gate drive circuit 101 that produces high side and low side gate drive signals HG and LG that drive (i.e., turn on and off) a first (high side) power transistor or switch 102 and a second (low side) power transistor or switch 103, respectively, within an overall integrated circuit (IC). The high side power transistor 102 is electrically connected between an input supply voltage Vin (e.g., at a first power node or high voltage node) and a phase or switching node 104, and the low side power transistor 103 is electrically connected between the phase node 104 and a ground (e.g., at a second power node or low voltage node). The high side and low side gate drive signals HG and LG generally alternate between turning on the high side power transistor 102 and turning on the low side power transistor 103 so that a switching voltage is produced at the phase node 104 between the high side power transistor 102 and the low side power transistor 103 in response to the turning on and off of the power transistors 102 and 103. The switching voltage is applied to an output inductor 105 and an output capacitor 106 to produce an output voltage Vout with a current sufficient to appropriately power a load 107 of an overall electronic circuit or device within which the switching regulator 100 is incorporated.

The gate drive circuit 101 is an electronic circuit that generates the high side and low side gate drive signals HG and LG with on-time pulse width durations and on-time polarity controlled by a PWM (pulse width modulation) signal. A PWM generator 108 generates the PWM signal in response to a ramp signal received from a ramp generator 109 (controlled by a system clock SYSCLK) and a compensator signal received from a feedback error amplifier 110. The feedback error amplifier 110 generates the compensator signal based on a reference voltage Vref and a feedback voltage Vfb (based on the output voltage Vout). Since FIG. 1 is a simplified schematic diagram, other components or controls may also be included in the switching regulator 100 but are not shown for simplicity of illustration and description. Additionally, the gate drive circuit 101 generally includes a non-overlap control circuit, or a delay control circuit (described below), that prevents overlap of on-time pulses of the high side and low side gate drive signals HG and LG (at the point in the IC at which the gate drive signals HG and LG are applied to the power transistors 102 and 103, respectively) or of on-time states of the power transistors 102 and 103 in a manner that ensures relatively short dead times without changing the duration of the on-time pulses or significantly altering the switching voltage, thereby efficiently preventing or mitigating a crowbar, shoot through, or short circuit current for the high side power transistor 102 and the low side power transistor 103.

The switching regulator 100 is shown as an electronic circuit of a buck converter with feedback for regulating the output voltage Vout. However, it is understood that this embodiment is only provided as an example electronic circuit in which the present invention can be used. Other embodiments may incorporate the present invention into a boost converter, a buck converter without feedback, an inverter, or any other appropriate types of electronic circuits that involve voltage signals having portions that should not be allowed to overlap. For the switching regulator 100, the voltage signals are the gate drive signals HG and LG, and the portions that should not overlap are those portions that produce the on-time states of the power transistors 102 and 103. Additionally, the power transistors 102 and 103 may be implemented as NFET devices, PFET devices, BJT devices, or any other appropriate switching devices or combinations thereof as may be appropriate for the desired design. For example, if both power transistors 102 and 103 are NFET devices, which are turned on by high polarity gate drive signals, then the portions of the gate drive signals HG and LG that should not overlap are the high voltage polarity portions of both. In another example, if one of the power transistors 102 and 103 is an NFET device (turned on by a high polarity gate drive signal) and the other is a PFET device (turned on by a low polarity gate drive signal), then the portions of the gate drive signals HG and LG that should not overlap are the high voltage polarity portion of the first one and the low voltage polarity portion of the second. In yet another example, it may be the low voltage polarity portions of both voltage signals that should not be allowed to overlap.

Figure 2:
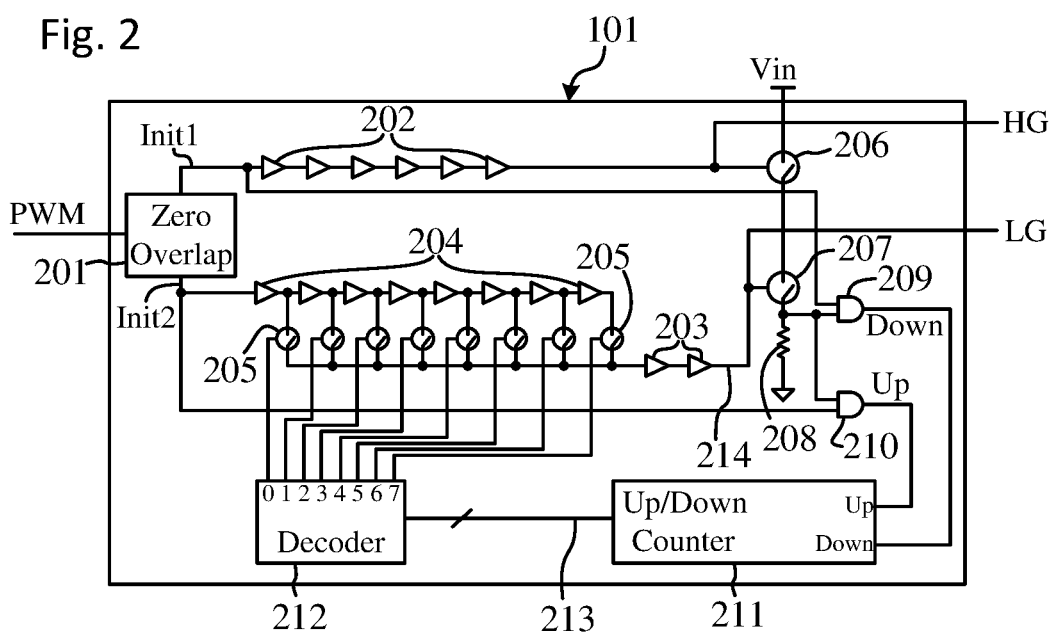
FIG. 2 is a simplified schematic diagram of a gate drive circuit for use in the switching regulator shown in FIG. 1, in accordance with some embodiments.

In accordance with some embodiments, the gate drive circuit 101, as shown in FIG. 2, generally includes a zero overlap circuit 201, high side delay elements 202, low side delay elements 203 and 204, selectable switches 205, a first (or high side) current detection transistor 206, a second (or low side) current detection transistor 207, a current detection resistor 208, first and second current detection logic gates 209 and 210, an up/down counter 211, and a count decoder 212. Additionally, since FIG. 1 is a simplified schematic diagram, other components or controls may also be included in the gate drive circuit 101 but are not shown for simplicity of illustration and description. For example, a bootstrap circuit and a voltage level shifter (not shown) may or may not be associated with the high side current detection transistor 206 (as well as with the high side power transistor 102), depending on whether it is implemented as an NFET device or a PFET device.

The high side gate drive signal HG is produced by the high side delay elements 202 based on a first initial non-overlap signal Init1 and is applied to the high side current detection transistor 206 as well as to the high side power transistor 102. The low side gate drive signal LG is produced by the low side delay elements 203 and 204 based on a second initial non-overlap signal Init2 and is applied to the low side current detection transistor 207 as well as to the low side power transistor 103. The first and second initial non-overlap signals Init1 and Init2 are generated by the zero overlap circuit 201. Additionally, the zero overlap circuit 201 generates the first initial non-overlap signal Init1 with first initial pulses and the second initial non-overlap signal Init2 with second initial pulses in a manner that ensures that the first initial pulses and the second initial pulses do not overlap in time at the point within the IC at which the initial non-overlap signals Init1 and Init2 are generated. The high side delay elements 202, thus, generate the high side gate drive signal HG with first drive pulses (of appropriate polarity) based on the first initial pulses, and the low side delay elements 203 and 204 generate the low side gate drive signal LG with second drive pulses (of appropriate polarity) based on the second initial pulses.

Although the first and second initial pulses of the first and second initial non-overlap signals Init1 and Init2 are specifically generated not to overlap, by the time the first and second drive pulses of the high side and low side gate drive signals HG and LG reach the high side and low side power transistors 102 and 103, respectively, (and the current detection transistors 206 and 207, respectively) the first and second drive pulses may have undergone different propagation delays through the switching regulator 100. The difference between the propagation delays of the high side and low side gate drive signals HG and LG generally depends on the relative lengths of the different electrical paths of the high side and low side gate drive signals HG and LG and the different electrical components within those electrical paths, among other factors. For example, depending on the implementation of the high side current detection transistor 206, the presence of a bootstrap circuit and/or a voltage level shifter in the electrical path of the high side gate drive signal HG may be a significant source of delay for the high side gate drive signal HG that is not present in the electrical path for the low side gate drive signal LG, thereby resulting in a differential delay that may vary depending on changing operating conditions or external factors, such as temperature or supply voltage variations. Other example sources of different variable propagation delays that can potentially result in on-time state overlap are provided below.

The low side delay elements 203 and 204 generally compensate for, or correct, the differences in the delays of the first and second drive pulses of the gate drive signals HG and LG, as described below, under control of the non-overlap control circuit, or delay control circuit. Therefore, after adjustments (e.g., decreasing or increasing) of the delay of the second drive pulses of the low side gate drive signal LG, the turning on (i.e., the on-time state) of the high side current detection transistor 206 and the turning on (i.e., the on-time state) of the low side current detection transistor 207 do not overlap, and the turning on (i.e., the on-time state) of the high side power transistor 102 and the turning on (i.e., the on-time state) of the low side power transistor 103 do not overlap.

The non-overlap control circuit generally includes the selectable switches 205, the high side current detection transistor 206, the low side current detection transistor 207, the current detection resistor 208, the current detection logic gates 209 and 210, the up/down counter 211, and the count decoder 212. The non-overlap control circuit (205-212) generally shifts the second drive pulses of the low side gate drive signal LG relative to the first drive pulses of the high side gate drive signal HG, as described below, without substantially changing the pulse width or duration or on-time of the first and second drive pulses of the gate drive signals HG and LG. In this manner, since the pulses of the first and second initial non-overlap signals Init1 and Init2 are specifically generated to have relatively small dead times between them, the shifting of the pulses of one of the signals, instead of changing a rising or falling edge of the pulses of one of the signals, ensures that the resulting drive pulses of the gate drive signals HG and LG will have similar (or about the same) relatively small dead times at the downstream points in the IC at which the gate drive signals HG and LG are applied to the power transistors 102 and 103, respectively.

The zero overlap circuit 201 generally represents any appropriate electronic components capable of generating two pulse signals (e.g., the first and second initial non-overlap signals Init1 and Init2) each having a series of on-time pulses, wherein the on-time pulses of one of the pulse signals do not overlap in time with the on-time pulses of the other of the pulse signals. An input of the zero overlap circuit 201 is electrically connected to the PWM generator 108 to receive the PWM signal. The zero overlap circuit 201 generates the first and second initial non-overlap signals Init1 and Init2 based on the received PWM signal. A first output of the zero overlap circuit 201 is electrically connected to a first one of the high side delay elements 202 and to a first input of the first current detection logic gate 209 to provide the first initial non-overlap signal Init1 thereto. A second output of the zero overlap circuit 201 is electrically connected to a first one of the low side delay elements 204 and to a first input of the second current detection logic gate 210 to provide the second initial non-overlap signal Init2 thereto.

In some embodiments, the high side delay elements 202 are considered or designed to be fixed delay elements electrically connected in series as a fixed delay circuit or a fixed delay buffer or inverter chain or string. The first one of the high side delay elements 202 receives the first initial pulses of the first initial non-overlap signal Init1, and a last or final one of the high side delay elements 202 outputs or produces the high side gate drive signal HG (which may be further applied to a downstream gate driver element before it is applied to the high side power transistor 102 and the high side current detection transistor 206, as needed). Thus, the delay of the high side gate drive signal HG is generally considered to be fixed and results from the first initial pulses of the first initial non-overlap signal Init1 propagating through each of the high side delay elements 202. The first drive pulses of the high side gate drive signal HG are, thus, a fixed delayed version of the first initial pulses of the first initial non-overlap signal Init1, wherein the total fixed delay of the first drive pulses relative to the first initial pulses is based on the sum of the delay contributions of each of the high side delay elements 202.

On the other hand, in some embodiments, the low side delay elements 203 and 204 are considered or designed to include some fixed delay elements and some programmable or selectable delay elements electrically connected in series as a programmable or selectable delay circuit or a programmable or selectable delay buffer chain or string. In the illustrated embodiment, the low side delay elements 203 are fixed low side delay elements 203 electrically connected in series as a fixed delay circuit or a fixed delay buffer or inverter chain or string, and the low side delay elements 204 are programmable or selectable low side delay elements 204 electrically connected in series as a programmable delay circuit or a programmable delay buffer chain or string. The first one of the selectable low side delay elements 204 receives the second initial pulses of the second initial non-overlap signal Init2, a selected one of the selectable low side delay elements 204 is electrically connected (as described below) to a first one of the fixed low side delay elements 203, and a final one of the fixed low side delay elements 203 outputs or produces the low side gate drive signal LG (which may be further applied to a downstream gate driver element before it is applied to the low side power transistor 103 and the low side current detection transistor 207, as needed). Thus, the delay of the low side gate drive signal LG is generally considered to be programmable or selectable due to operation or selection of the selectable low side delay elements 204, as described below. The second drive pulses of the low side gate drive signal LG are, thus, a programmable or selectable delayed version of the second initial pulses of the second initial non-overlap signal Init2, wherein the total programmable delay of the second drive pulses relative to the second initial pulses is based on the sum of the delay contributions of each of the fixed low side delay elements 203 and of each of the selectable low side delay elements 204 that have been selected to contribute to the total programmable delay, as described below.

In some alternative embodiments, the high side delay elements include or are selectable delay elements, and the low side delay elements are fixed. In this case, the delay of the low side gate drive signal LG is generally considered to be fixed, and the delay of the high side gate drive signal HG is generally considered to be programmable or selectable. In some other alternative embodiments, the high side delay elements and the low side delay elements both include or are selectable delay elements. In this case, the delays of the high side gate drive signal HG and of the low side gate drive signal LG are both generally considered to be programmable or selectable. Such embodiments have a potential benefit of using fewer overall delay elements. However, additional electronic components may have to be included in these embodiments in order to provide proper voltage levels to properly drive the high and low side delay elements, and these components may have an effect on the different variable propagation delays through these electrical paths.

The non-overlap control circuit (205-212) generally includes a current detection circuit that generally includes the high side current detection transistor 206, the low side current detection transistor 207, the current detection resistor 208, and the current detection logic gates 209 and 210. The current detection circuit (206-210) generally detects a sample current that may flow through the high side current detection transistor 206 and the low side current detection transistor 207 in response to the on-time state of the high side current detection transistor 206 overlapping in time with the on-time state of the low side current detection transistor 207, such that an electrical current path is established between the input supply voltage Vin and the ground through the current detection resistor 208 during the overlap of the on-time states.

The overlap of the on-time states of the current detection transistors 206 and 207 generally matches an overlap in the on-time pulses of the high side and low side gate drive signals HG and LG. Since the on-time pulses of the high side and low side gate drive signals HG and LG also drive the high side and low side power transistors 102 and 103, the sample current produced by the overlap in the on-time states of the current detection transistors 206 and 207 generally closely tracks, reflects or matches any crowbar, shoot through, or short circuit current that may be produced in the event of an overlap in the on-time states of the high side power transistor 102 and the low side power transistor 103. Thus, the sample current through the current detection transistors 206 and 207 is referred to herein as a crowbar (or shoot through or short circuit) detection current, since the generation and detection of the sample current is also considered to be a detection of an occurrence of the crowbar, shoot through, or short circuit current.

In the illustrated embodiment, the presence of the current detection resistor 208 in the electrical current path (when established) between the input supply voltage Vin and the ground causes a current-detect voltage (or a crowbar-detect voltage) to be generated due to the crowbar detection current. A resistance of the current detection resistor 208 is selected to ensure that a voltage level of the current-detect voltage (due to the crowbar detection current) does not adversely affect the operation of the low side current detection transistor 207, i.e., this voltage level is preferably relatively small or is relatively close to ground. In some embodiments, therefore, a comparator (or other appropriate component, not shown) is used to detect the current-detect voltage and to reproduce the current-detect voltage with a logic voltage level that is appropriate for application to a second input of the first current detection logic gate 209 and a second input of the second current detection logic gate 210. Additionally, the current detection resistor 208 may be placed at any appropriate location between the input supply voltage Vin and the ground, e.g., between the low side current detection transistor 207 and ground (so that the current-detect voltage is generated at a node between the low side current detection transistor 207 and the current detection resistor 208), as shown in the illustrated embodiment. In other embodiments, any other appropriate component(s) for detecting the presence of the crowbar detection current or generating the crowbar-detect voltage may be used in place of the current detection resistor 208.

In some embodiments, the first and second current detection logic gates 209 and 210 are AND gates (as shown). However, other embodiments may use NAND gates or any other appropriate components that can be activated to produce an appropriate output signal (for application to the up/down counter 211) in response to the first initial non-overlap signal Init1 and the current-detect voltage (for one of the components) and in response to the second initial non-overlap signal Init2 and the current-detect voltage (for the other of the components).

The current detection circuit (206-210) generates a down pulse (i.e., a first corrective pulse) or an up pulse (i.e., a second corrective pulse) in response to the crowbar detection current, depending on whether the detection of the crowbar detection current (or generation of the crowbar-detect voltage) coincides with the first initial non-overlap signal Init1 or the second initial non-overlap signal Init2, respectively. The down pulse generally indicates that the delay of the low side gate drive signal LG is too long, so the delay needs to be decreased, or stepped down. Thus, decreasing of the delay of the second drive pulses of the low side gate drive signal LG occurs based on the down pulse. On the other hand, the up pulse generally indicates that the delay of the low side gate drive signal LG is too short, so the delay needs to be increased, or stepped up. Thus, increasing of the delay of the second drive pulses of the low side gate drive signal LG occurs based on the up pulse.

In the illustrated embodiment, down pulses (of a step down signal) are generated by the first current detection logic gate 209 in response to detections of the crowbar detection current (or generation of the crowbar-detect voltage) coinciding with pulses of the first initial non-overlap signal Init1, e.g., when the inputs of the first current detection logic gate 209 (being an AND gate) are both logic high, the output thereof (i.e., the step down signal) is logic high. In other words, the first current detection logic gate 209 generates the down pulse based on the time of the flowing of the crowbar detection current overlapping with any one of the first initial pulses of the first initial non-overlap signal Init1. Additionally, up pulses (of a step up signal) are generated by the second current detection logic gate 210 in response to detections of the crowbar detection current (or generation of the crowbar-detect voltage) coinciding with pulses of the second initial non-overlap signal Init2, e.g., when the inputs of the second current detection logic gate 210 (being an AND gate) are both logic high, the output thereof (i.e., the step up signal) is logic high. In other words, the second current detection logic gate 210 generates the up pulse based on the time of the flowing of the crowbar detection current overlapping with any one of the second initial pulses of the second initial non-overlap signal Init2. Since the first initial non-overlap signal Init1 never overlaps with the second initial non-overlap signal Init2, none of the down pulses will occur at the same time as any of the up pulses. (Other embodiments may result in the down and up pulses being logic low.)

The up/down counter 211 generally represents any appropriate circuit that can step down and step up a count signal, e.g., a multibit count signal 213, in response to a step down signal and a step up signal, respectively. Thus, the up/down counter 211 generally has a down input electrically connected to the output of the first current detection logic gate 209, an up input electrically connected to the output of the second current detection logic gate 210, and a count output electrically connected to an input of the count decoder 212. The up/down counter 211 receives at its down input down pulses (of the step down signal) as they are generated by the first current detection logic gate 209, and receives at its up input up pulses (of the step up signal) as they are generated by the first current detection logic gate 209. Additionally, the up/down counter 211 generates at its count output the multibit count signal 213 having a count value that decreases in response to each down pulse and increases in response to each up pulse. Thus, the decreasing of the delay of the second drive pulses of the low side gate drive signal LG occurs based on the decreasing of the count value of the up/down counter 211; and the increasing of the delay of the second drive pulses of the low side gate drive signal LG occurs based on the increasing of the count value of the up/down counter 211.

The count decoder 212 generally represents any appropriate circuit that activates (or asserts, e.g., drives logic high) a single output signal bit from among several output signal bits based on a multibit input signal having a multibit value. Each output signal bit corresponds to one possible value of the multibit value. Thus, the count decoder 212 generally has a multibit input electrically connected to the count output of the up/down counter 211 to receive the multibit count signal 213 as its input signal. Additionally, the count decoder 212 generally has several single-bit outputs, labeled in this example as 0-7. The count decoder 212 activates one of the single-bit outputs 0-7 based on the count value of the multibit count signal 213, e.g., the count decoder 212 activates the single-bit output 0 when the received multibit count signal 213 has a count value of 0, the count decoder 212 activates the single-bit output 1 when the received multibit count signal 213 has a count value of 1, the count decoder 212 activates the single-bit output 2 when the received multibit count signal 213 has a count value of 2, and so on.

Each single-bit output 0-7 of the count decoder 212 corresponds to one of the selectable switches 205 and one of the selectable low side delay elements 204. Thus, each single-bit output 0-7, each selectable switch 205, and each selectable low side delay element 204 corresponds to a respective predetermined value for the count value of the multibit count signal 213.

Each single-bit output 0-7 is electrically connected to an activation node of its corresponding selectable switch 205. Additionally, each selectable switch 205 is electrically connected between the output of its corresponding selectable low side delay element 204 and the first fixed low side delay element 203. The final fixed low side delay element 203 is electrically connected to an overall output 214 for the second drive pulses of the low side gate drive signal LG.

Each selectable low side delay element 204 outputs a respective intermediate delayed version of the second initial pulses of the second initial non-overlap signal Init2. The delay amount of each intermediate delayed version depends on, or is based on, the delay contribution of the selectable low side delay element 204 that outputs that intermediate delayed version and the delay contribution of all preceding selectable low side delay elements 204. A first one of the selectable low side delay elements 204 produces a first intermediate delayed version of the second initial pulses with a first selectable delay amount. The combination of first selectable delay amount and the delay amount of the fixed low side delay elements 203 results in a total programmable delay amount for the low side gate drive signal LG that is shorter than the fixed delay amount of the high side gate drive signal HG output by the high side delay elements 202. A minimum selectable delay by the low side delay elements 203 and 204, therefore, is based on the delay contribution of the fixed low side delay elements 203 and only the first selectable low side delay element 204. In some embodiments, however, the first selectable switch 205 could electrically connect between the second output of the zero overlap circuit 201 (for the second initial non-overlap signal Init2) and the input of the first selectable low side delay element 204, so that there is one more selectable switch 205 than there are selectable low side delay elements 204, and so that the minimum selectable delay is based on only the delay contribution of the fixed low side delay elements 203. Additionally, a last or final one of the selectable low side delay elements 204 produces a final intermediate delayed version of the second initial pulses with a final selectable delay amount. The combination of final selectable delay amount and the delay amount of the fixed low side delay elements 203 results in a total programmable delay amount for the low side gate drive signal LG that is longer than the fixed delay amount of the high side gate drive signal HG. A maximum selectable delay by the low side delay elements 203 and 204, therefore, is based on the delay contributions for all of the low side delay elements 203 and 204.

When one of the single-bit outputs 0-7 is activated in accordance with the count value of the multibit count signal 213 (and, thus, all of the other single-bit outputs are deactivated), its corresponding selectable switch 205 is closed or activated (and all of the other selectable switches 205 are opened or deactivated). The activated one of the selectable switches 205, thus, electrically connects the output of its corresponding selectable low side delay element 204 to the first one of the fixed low side delay elements 203. In this manner, the intermediate delayed version of the second initial pulses of the second initial non-overlap signal Init2 outputted by the corresponding selectable low side delay element 204 is selected to be provided to the fixed low side delay elements 203 to be used to generate the second drive pulses of the low side gate drive signal LG, until the count value of the multibit count signal 213 changes. Additionally, the count value changes each time the crowbar detection current is allowed to flow through the current detection transistors 206 and 207, thereby causing the generation of either the down pulse or the up pulse, thereby causing the up/down counter 211 to step the multibit count signal 213 down or up, respectively, thereby causing a total delay of the second drive pulses of the low side gate drive signal LG to decrease or increase, respectively. Furthermore, repeating the method for decreasing and/or increasing the total delay of the second drive pulses of the low side gate drive signal LG eventually adjusts the total delay to an amount that results in the on-time state of the high side current detection transistor 206 (and the high side power transistor 102) not overlapping with (or having an insignificant overlap with) the on-time state of the low side current detection transistor 207 (and the low side power transistor 103), thereby eliminating, reducing or minimizing the crowbar current. Furthermore, the delay contribution of each of the selectable low side delay elements 204 is generally shorter than the dead time for the non-overlap signals Init1 and Init2 and the gate drive signals HG and LG, thereby ensuring that repeated changing of the programmable delay amount of the low side gate drive signal LG will eventually result in non-overlap of the gate drive signals HG and LG.

In the illustrated example, since there are eight selectable low side delay elements 204, there are eight corresponding single-bit outputs 0-7 and eight corresponding selectable switches 205. Therefore, selection of one of the eight single-bit outputs 0-7 can be determined from a 3-bit input signal (i.e., 3 signal lines) for the multibit count signal 213. However, other embodiments may have any appropriate number of selectable low side delay elements 204, depending on a desired or required range for the programmable or selectable delay of the low side gate drive signal LG, e.g., between the minimum selectable delay that is shorter than the fixed delay of the high side gate drive signal HG and the maximum selectable delay that is longer than the fixed delay of the high side gate drive signal HG. In which case, the multibit count signal 213 may have any appropriate number of signal lines needed to address the total number of selectable low side delay elements 204 through the corresponding single-bit outputs and the corresponding selectable switches 205. Additionally, testing or simulation of a given implementation of the switching regulator 100 can potentially determine the maximum and minimum selectable delays for the low side gate drive signal LG (i.e., how much longer and how much shorter the delay of the low side gate drive signal LG needs to be than the fixed delay of the high side gate drive signal HG) in order for the switching regulator 100 to operate properly. The number of the selectable low side delay elements 204 is generally determined based on the desired range of the selectable delay (determined from the desired maximum and minimum selectable delays) and the delay contribution of each one of the selectable low side delay elements 204.

Additionally, the number and size of optional fixed low side delay elements 203 and the number and size of the high side delay elements 202 may be based at least on the desired minimum selectable delay for the low side gate drive signal LG relative to an appropriate fixed delay of the high side gate drive signal HG as well as on fanout considerations described below. In the illustrated embodiment, for example, the high side delay elements 202 have a fixed overall delay for the high side gate drive signal HG and the fixed low side delay elements 203 contribute a fixed amount of delay to the low side gate drive signal LG. Therefore, the number and size of the high side delay elements 202 and the fixed low side delay elements 203 may be selected such that: the maximum selectable delay of the selectable low side delay elements 204 is positioned at an appropriate point after the fixed overall delay for the high side gate drive signal HG, and the minimum selectable delay of the selectable low side delay elements 204 is positioned at an appropriate point before the fixed overall delay for the high side gate drive signal HG. For example, if it is desired for the fixed overall delay for the high side gate drive signal HG to typically occur at about a midpoint between the maximum and minimum points of the programmable delay of the low side gate drive signal LG, then number and size of the high side delay elements 202 and the fixed low side delay elements 203 are selected such that the fixed overall delay of the high side delay elements 202 will be expected to be approximately the same (without consideration for propagation delay variations) as the programmable delay of the low side delay elements 203 and 204 when the selectable low side delay element 204 at about the middle of the chain of the selectable low side delay elements 204 is selected to provide its output to the fixed low side delay elements 203. If a larger difference is desired between the minimum selectable delay for the low side gate drive signal LG and the fixed delay of the high side gate drive signal HG, then either fewer of the optional fixed low side delay elements 203 or more of the high side delay elements 202 may be used or the sizes thereof may be appropriately altered. On the other hand, if a smaller difference is desired between the minimum selectable delay for the low side gate drive signal LG and the fixed delay of the high side gate drive signal HG, then either more of the optional fixed low side delay elements 203 or fewer of the high side delay elements 202 may be used or the sizes thereof may be appropriately altered.

In some embodiments, the zero overlap circuit 201 includes relatively small electronic components, such as cross coupled NAND gates, which are generally not capable of producing outputs that are sufficient for driving the power transistors 102 and 103 and the current detection transistors 206 and 207. To ensure that the high side gate drive signal HG is capable of driving both the high side power transistor 102 and the high side current detection transistor 206, therefore, the high side delay elements 202 may increase in size, such that at least one of the high side delay elements 202 is larger than its preceding delay element 202 in the chain. In this manner, the final high side delay element 202 is capable of producing the high side gate drive signal HG with a fanout sufficient to drive both the high side power transistor 102 and the high side current detection transistor 206. Similarly, to ensure that the low side gate drive signal LG is capable of driving both the low side power transistor 103 and the low side current detection transistor 207, at least one of the fixed low side delay elements 203 is larger than its preceding delay element 203 in the chain, such that the final fixed low side delay element 203 is capable of producing the low side gate drive signal LG with a fanout sufficient to drive both the low side power transistor 103 and the low side current detection transistor 207. Additionally, due to differences in the numbers of the high side delay elements 202 and the fixed low side delay elements 203, these elements will likely not be implemented by exactly the same devices. Furthermore, in some embodiments, one or more of the high side delay elements 202 is an inverter, with a result being a desired on-time voltage polarity for the first drive pulses of the high side gate drive signal HG. Similarly, one or more of the fixed low side delay elements 203 may be an inverter, with a result being a desired on-time voltage polarity for the second drive pulses of the low side gate drive signal LG. On the other hand, the selectable low side delay elements 204 are all preferably non-inverting buffers, so that each of the intermediate delayed versions output by the selectable low side delay elements 204 has the same on-time voltage polarity, so that whichever intermediate delayed version is selected to be provided to the fixed low side delay elements 203 has the expected on-time voltage polarity. These differences in numbers, sizes and types of devices (among others not mentioned) between the high side delay elements 202 and the low side delay elements 203 and 204, therefore, represent additional sources of different variable propagation delays through the two paths for the high side gate drive signal HG and the low side gate drive signal LG that can potentially result in on-time state overlap.

Figure 3:
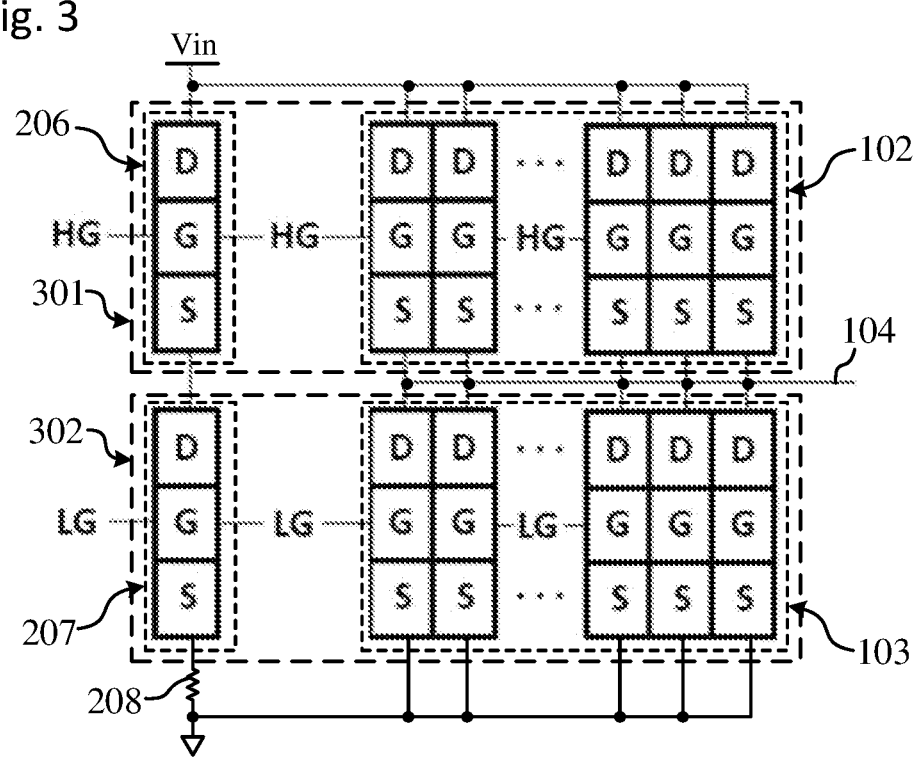
FIG. 3 shows simplified layouts of transistor segments for use in the switching regulator shown in FIG. 1, in accordance with some embodiments.

In some embodiments, in order for the crowbar detection current through the current detection transistors 206 and 207 to accurately reflect or match any crowbar current for the high and low side power transistors 102 and 103, the current detection transistors 206 and 207 are formed with the high and low side power transistors 102 and 103, respectively. In many designs of power transistors, such as the high and low side power transistors 102 and 103, an array of transistor segments is used to form each of the power transistors. FIG. 3 illustrates such a design, including a first array 301 of first or high side transistor segments formed together in a "finger-like" arrangement and a second array 302 of second or low side transistor segments also formed together in a "finger-like" arrangement. In this example, the first array 301 of first or high side transistor segments includes several high side source segments S, several high side gate segments G, and several high side drain segments $Dh_{1-n}$. Similarly, the second array 302 of second or low side transistor segments includes several low side source segments S, several low side gate segments G, and several low side drain segments D. Although six of the high and low side transistor segments are shown in FIG. 3, any appropriate number of each may be used.

In some embodiments, therefore, the high side current detection transistor 206 is formed from one (or more) of the high side transistor segments. Additionally, the high side power transistor 102 is formed from the other (or the remainder of) the high side transistor segments. Similarly, in some embodiments, the low side current detection transistor 207 is formed from one (or more) of the low side transistor segments. Additionally, the low side power transistor 103 is formed from the other (or the remainder of) the low side transistor segments.

Thus, the high side drain segment D for the high side current detection transistor 206 is electrically connected to the input supply voltage Vin, the high side source segment S for the high side current detection transistor 206 is electrically connected to the low side drain segment D for the low side current detection transistor 207, and the low side source segment S for the low side current detection transistor 207 is electrically connected through the current detection resistor 208 to the ground. Additionally, the high side drain segments D for the high side power transistor 102 are electrically connected the input supply voltage Vin, the high side source segments S for the high side power transistor 102 are electrically connected to the low side drain segments D for the low side power transistor 103, and the low side source segments S for the low side power transistor 103 are electrically connected to the ground.

Furthermore, the high side gate segments G for both the high side current detection transistor 206 and the high side power transistor 102 are electrically connected together through a connector to the high side gate drive signal HG. Additionally, the low side gate segments G for both the low side current detection transistor 207 and the low side power transistor 103 are electrically connected together to a connector to the low side gate drive signal LG.

In this configuration, since the current detection transistors 206 and 207 are formed among the same transistor segments as those of the power transistors 102 and 103, the delay of the gate drive signals HG and LG at the point in the IC at which the gate drive signals HG and LG are applied to the current detection transistors 206 and 207, respectively, will be similar to or the same as the delay of the gate drive signals HG and LG at the point in the IC at which the gate drive signals HG and LG are applied to the power transistors 102 and 103, respectively. The similarity in the delays of the gate drive signals HG and LG is generally due to the similarities in the components and/or pathways between the sources of the drive signals and these transistors.

Therefore, with the current detection transistors 206 and 207 formed from the same transistor segments as those of the power transistors 102 and 103 and driven by the same gate drive signals HG and LG, the operation of the current detection transistors 206 and 207 will closely match that of the power transistors 102 and 103. In this manner, any crowbar detection current produced by an overlap in the on-time states of the current detection transistors 206 and 207 will accurately reflect or closely match any crowbar current produced in the event of an overlap in the on-time states of the power transistors 102 and 103. Since the crowbar detection current is produced in the same manner as and closely matches the crowbar current, the detection of the crowbar detection current is considered to be a direct detection of the crowbar current, as opposed to an indirect detection of crowbar current based on the level of the switching voltage produced at the phase node 104. Thus, this technique is considered to provide a more reliable detection of the crowbar current than that of such indirect techniques. Additionally, since far fewer transistor segments are used for the current detection transistors 206 and 207 than for the power transistors 102 and 103, an on resistance of the current detection transistors 206 and 207 will be comparatively much higher than the on resistance of the power transistors 102 and 103, so much less current will flow through the current detection transistors 206 and 207 than flows through the power transistors 102 and 103.

Additionally, in some embodiments, placement of the current detection logic gates 209 and 210 may be as close to the current detection transistors 206 and 207 as may be practical, so that little or no additional delays in the gate drive signals HG and LG affect the production of the up and down signals. Therefore, the detection of the crowbar detection current, as indicated by the production of the down and up signals by the current detection logic gates 209 and 210 (FIG. 2), accurately reflects detection of the crowbar current.

Figure 4:
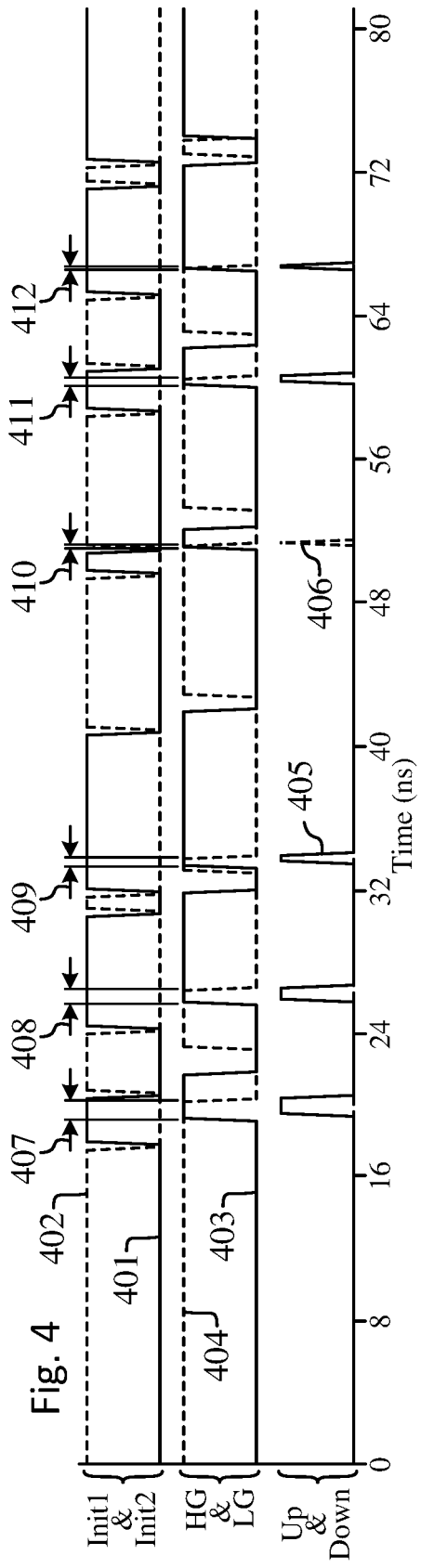
FIGS. 4 and 5 show simplified timing diagrams illustrating operation of the gate drive circuit shown in FIG. 2, in accordance with some embodiments.
Figure 5:
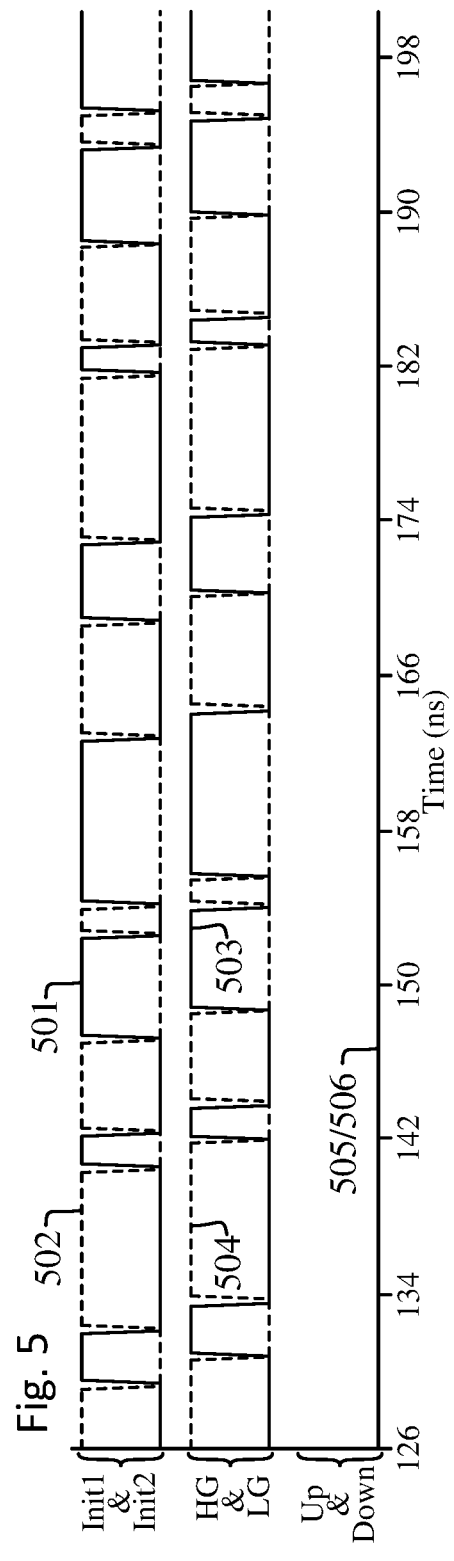

FIGS. 4 and 5 show simplified timing diagrams produced from a circuit simulation illustrating operation of the gate drive circuit 101, in accordance with some embodiments. Timing diagrams for the first initial non-overlap signal Init1 (solid line timing diagrams 401 and 501), the second initial non-overlap signal Init2 (dashed line timing diagrams 402 and 502), the high side gate drive signal HG (solid line timing diagrams 403 and 503), the low side gate drive signal LG (dashed line timing diagrams 404 and 504), the down signal (solid line timing diagrams 405 and 505), and the up signal (dashed line timing diagrams 406 and 506) are presented. Some propagation delays for some of the signals may have resulted in some points in some of the timing diagrams not lining up perfectly with corresponding points in the other timing diagrams. In this example, it is the high voltage polarity portions of both the high side gate drive signal HG and the low side gate drive signal LG that should not be allowed to overlap.

During a first time period 407, the high side gate drive signal HG (403) and the low side gate drive signal LG (404) overlapped, and this overlap can be seen to coincide with the first initial non-overlap signal Init1 (401). Thus, a first pulse of the down signal (405) was generated during the first time period 407. During a second time period 408, the high side gate drive signal HG (403) and the low side gate drive signal LG (404) overlapped, and this overlap can be seen to coincide with the first initial non-overlap signal Init1 (401). Thus, a second pulse of the down signal (405) was generated during the second time period 408. During a third time period 409, the high side gate drive signal HG (403) and the low side gate drive signal LG (404) overlapped, and this overlap can be seen to coincide with the first initial non-overlap signal Init1 (401). Thus, a third pulse of the down signal (405) was generated during the third time period 409. During a fourth time period 410, the high side gate drive signal HG (403) and the low side gate drive signal LG (404) overlapped, and this overlap can be seen to coincide with the second initial non-overlap signal Init2 (402). Thus, a pulse of the up signal (406) was generated during the fourth time period 410. During a fifth time period 411, the high side gate drive signal HG (403) and the low side gate drive signal LG (404) overlapped, and this overlap can be seen to coincide with the first initial non-overlap signal Init1 (401). Thus, a fourth pulse of the down signal (405) was generated during the fifth time period 411. During a sixth time period 412, the high side gate drive signal HG (403) and the low side gate drive signal LG (404) overlapped, and this overlap can be seen to coincide with the first initial non-overlap signal Init1 (401). Thus, a fifth pulse of the down signal (405) was generated during the sixth time period 412.

As can be seen, the low side gate drive signal LG (404) started with too much selectable delay, which thus needed to be stepped down or decreased. The decrease in the selectable delay with each cycle of the low side gate drive signal LG (404) is reflected in the decreasing duration of each succeeding time period and pulse of the down signal (405). The pulse of the up signal (406) represents an anomaly in which the selectable delay of the low side gate drive signal LG (404) was stepped up, even though the selectable delay was still to large. This anomaly is considered acceptable, because subsequent cycles result in correcting for the anomaly and continuing to decrease the duration of each succeeding time period and pulse of the down signal (405), thereby eventually eliminating the overlap or reducing it to a point of insignificance. After the overlap has been eliminated, no further pulses of either the down signal (405) or the up signal (406) occur, as shown by the relatively steady state condition of the timing diagrams in FIG. 5 in which the down and up signals (505 and 506) have no pulses.

However, possible later changes in any relevant operating conditions (e.g., a temperature change of the IC, a change in the input supply voltage Vin, a change in the output voltage Vout, etc.) may cause a change in the delay of either the high side gate drive signal HG (403), the low side gate drive signal LG (404), or both. As a consequence, an overlap of the high side gate drive signal HG (403) and the low side gate drive signal LG (404) may once again occur, but generation of the down signal (405) or the up signal (406) will quickly adjust the selectable delay of the low side gate drive signal LG (404). In this manner, control over any overlap and maintenance of an appropriate dead time is continually adaptive.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method comprising:
   generating first initial pulses within an integrated circuit;
   generating second initial pulses within the integrated circuit, the second initial pulses not overlapping in time with the first initial pulses;
   generating first drive pulses that are based on and delayed from the first initial pulses;
   generating second drive pulses that are based on and delayed from the second initial pulses;
   detecting a current flow in response to an on-time overlap of an on-time state of the first drive pulses with an on-time state of the second drive pulses;
   decreasing the delay of the second drive pulses based on a time of the current flow overlapping with one of the first initial pulses; and
   increasing the delay of the second drive pulses based on the time of the current flow overlapping with one of the second initial pulses.

2. The method of claim 1, wherein:
repeating of the method adjusts the delay of the second drive pulses to an amount that results in the on-time state of the first drive pulses not overlapping with the on-time state of the second drive pulses.

3. The method of claim 2, wherein:
the first drive pulses drive a first transistor within the integrated circuit;
the second drive pulses drive a second transistor within the integrated circuit;
the first transistor is one of an array of first transistor segments that includes other first transistor segments, the other first transistor segments forming a first power transistor;
the second transistor is one of an array of second transistor segments that includes other second transistor segments, the other second transistor segments forming a second power transistor;
the first power transistor and the second power transistor are electrically connected between a first power node and a second power node and produce a switching voltage at a phase node between the first power transistor and the second power transistor in response to turning on and off the first power transistor and the second power transistor;
the method further comprises turning on the first power transistor by the first drive pulses and turning on the second power transistor by the second drive pulses; and
after adjustments of the delay of the second drive pulses, an on-time state of the first transistor and an on-time state of the second transistor do not overlap, and an on-time state of the first power transistor and an on-time state of the second power transistor do not overlap.

4. The method of claim 1, further comprising:
generating a first corrective pulse based on the time of the current flow overlapping with the one of the first initial pulses; and
generating a second corrective pulse based on the time of the current flow overlapping with the one of the second initial pulses;
and wherein:
the decreasing of the delay of the second drive pulses occurs based on the first corrective pulse; and
the increasing of the delay of the second drive pulses occurs based on the second corrective pulse.

5. The method of claim 4, further comprising:
decreasing a count value of a counter in response to the first corrective pulse; and
increasing the count value of the counter in response to the second corrective pulse;
and wherein:
the decreasing of the delay of the second drive pulses occurs based on the decreasing of the count value of the counter; and
the increasing of the delay of the second drive pulses occurs based on the increasing of the count value of the counter.

6. The method of claim 5, wherein:
the first drive pulses drive a first transistor within the integrated circuit;
the second drive pulses drive a second transistor within the integrated circuit; and
the method further comprises:
providing the second initial pulses to a delay buffer chain having a plurality of delay elements, the plurality of delay elements being electrically connected in series, each of the plurality of delay elements outputting a respective intermediate delayed version of the second initial pulses, each of the plurality of delay elements corresponding to a respective predetermined value;
electrically connecting an output of one of the plurality of delay elements to the second transistor, the predetermined value corresponding to the one of the plurality of delay elements being the same as the count value of the counter; and
providing the intermediate delayed version of the second initial pulses outputted by the one of the plurality of delay elements to the second transistor, the intermediate delayed version of the second initial pulses being provided as the second drive pulses.

7. The method of claim 6, further comprising:
generating a fixed delayed version of the first initial pulses with a fixed delay amount, the fixed delayed version of the first initial pulses being the first drive pulses;
and wherein:
a first one of the plurality of delay elements produces a first intermediate delayed version of the second initial pulses with a first selectable delay amount that is shorter than the fixed delay amount; and
a final one of the plurality of delay elements produces a final intermediate delayed version of the second initial pulses with a final selectable delay amount that is longer than the fixed delay amount.

8. An electronic circuit comprising:
a means for generating first drive pulses that are based on and delayed from first initial pulses;
a means for generating second drive pulses that are based on and delayed from second initial pulses, wherein the first initial pulses do not overlap in time with the second initial pulses;
a means for detecting a current flow in response to an on-time overlap of an on-time state of the first drive pulses with an on-time state of the second drive pulses; and
a programmable delay circuit in a gate drive circuit that decreases the delay of the second drive pulses based on the current flow overlapping with one of the first initial pulses, and that increases the delay of the second drive pulses based on the current flow overlapping with one of the second initial pulses.

9. The electronic circuit of claim 8, wherein:
by decreasing or increasing the delay of the second drive pulses, the programmable delay circuit repeatedly adjusts the delay of the second drive pulses until the on-time state of the first drive pulses and the on-time state of the second drive pulses do not overlap.

10. The electronic circuit of claim 9, further comprising:
a first transistor;
a second transistor;
a plurality of first transistor segments including a first transistor segment and other first transistor segments, the first transistor segment forming the first transistor;
a plurality of second transistor segments including a second transistor segment and other second transistor segments, the second transistor segment forming the second transistor;
a first power transistor formed from the other first transistor segments, the first power transistor being electrically connected between an input voltage node and a phase node, the first power transistor being driven by the first drive pulses; and
a second power transistor formed from the other second transistor segments, the second power transistor being electrically connected between the phase node and a ground node, the second power transistor being driven by the second drive pulses, the first power transistor and the second power transistor producing a switching voltage at the phase node, and an on-time state the first power transistor and an on-time state the second power transistor not overlapping after adjustments of the delay of the second drive pulses.

11. The electronic circuit of claim 8, wherein:
the means for detecting the current flow produces a first corrective pulse in response to the current flow overlapping with the one of the first initial pulses;
the means for detecting the current flow produces a second corrective pulse in response to the current flow overlapping with the one of the second initial pulses;
the programmable delay circuit decreases the delay of the second drive pulses based on the first corrective pulse; and
the programmable delay circuit increases the delay of the second drive pulses based on the second corrective pulse.

12. The electronic circuit of claim 11, further comprising:
a counter in the gate drive circuit that produces a count signal, the counter decreasing a count value in response to the first corrective pulse, and the counter increasing the count value in response to the second corrective pulse;
and wherein:
the programmable delay circuit decreases the delay of the second drive pulses based on the decreasing of the count value; and
the programmable delay circuit increases the delay of the second drive pulses based on the increasing of the count value.

13. The electronic circuit of claim 12, wherein:
the programmable delay circuit further comprises a plurality of selectable delay elements electrically connected in series, each of the plurality of selectable delay elements outputting a respective intermediate delayed version of the second initial pulses, each of the plurality of selectable delay elements corresponding to a respective predetermined value; and
the intermediate delayed version of the second initial pulses outputted by a selected one of the plurality of selectable delay elements is provided to the means for detecting the current flow, the predetermined value corresponding to the selected one of the plurality of selectable delay elements being the same as the count value of the counter.

14. The electronic circuit of claim 13, further comprising:
a fixed delay circuit in the gate drive circuit, the fixed delay circuit adding a fixed delay amount to the first initial pulses to produce a fixed delayed version of the first initial pulses, the fixed delayed version of the first initial pulses being the first drive pulses;
and wherein:
a first one of the plurality of selectable delay elements produces a first intermediate delayed version of the second initial pulses with a first selectable delay amount that is shorter than the fixed delay amount; and
a final one of the plurality of selectable delay elements produces a final intermediate delayed version of the second initial pulses with a final selectable delay amount that is longer than the fixed delay amount.

15. An electronic circuit comprising:
a first current detection transistor that is driven by first drive pulses, wherein an array of first transistor segments comprises a first transistor segment and other first transistor segments, and the first current detection transistor comprises the first transistor segment;
a second current detection transistor that is driven by second drive pulses, wherein an array of second transistor segments comprises a second transistor segment and other second transistor segments, the second current detection transistor comprises the second transistor segment, and a sample current is flowed through the first current detection transistor and the second current detection transistor in response to an on-time state of the first current detection transistor overlapping with an on-time state of the second current detection transistor; and
a programmable delay circuit that reduces the sample current by shifting the second drive pulses based on a detection of the sample current through the first current detection transistor and the second current detection transistor.

16. The electronic circuit of claim 15, wherein:
repeatedly shifting the second drive pulses by the programmable delay circuit results in eliminating the sample current.

17. The electronic circuit of claim 15, further comprising:
a means for generating first initial pulses with which the first drive pulses are generated; and
a means for generating second initial pulses with which the second drive pulses are generated, the second initial pulses not overlapping in time with the first initial pulses;
and wherein:
the programmable delay circuit changes a delay of the second drive pulses based on a time of the sample current flow overlapping with one of the first initial pulses or one of the second initial pulses.

18. The electronic circuit of claim 17, further comprising:
a means for generating a first corrective pulse based on the time of the sample current flow overlapping with the one of the first initial pulses; and
a means for generating a second corrective pulse based on the time of the sample current flow overlapping with the one of the second initial pulses;
and wherein:
the programmable delay circuit changes the delay of the second drive pulses based on the first corrective pulse or the second corrective pulse.

19. The electronic circuit of claim 18, further comprising:
a counter that outputs a count value, wherein the counter decreases the count value in response to the first corrective pulse, and the counter increases the count value in response to the second corrective pulse;
and wherein:
the programmable delay circuit changes the delay of the second drive pulses based on the decreasing of the count value of the counter or the increasing of the count value of the counter.

20. The electronic circuit of claim 19, further comprising:
a delay buffer chain having a plurality of delay elements, wherein the second initial pulses are provided to the delay buffer chain, the plurality of delay elements are electrically connected in series, each of the plurality of delay elements outputs a respective delayed version of the second initial pulses, and each of the plurality of delay elements corresponds to a respective predetermined value; and
a means for electrically connecting an output of one of the plurality of delay elements to an output for the second drive pulses, the predetermined value corresponding to the one of the plurality of delay elements being the same as the count value of the counter;

and wherein:

the delayed version of the second initial pulses outputted by the one of the plurality of delay elements is provided as the second drive pulses.

\* \* \* \* \*